United States Patent
Jung

(10) Patent No.: US 8,133,547 B2
(45) Date of Patent: Mar. 13, 2012

(54) PHOTORESIST COATING COMPOSITION AND METHOD FOR FORMING FINE CONTACT OF SEMICONDUCTOR DEVICE

(75) Inventor: Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 1053 days.

(21) Appl. No.: 11/772,578

(22) Filed: Jul. 2, 2007

(65) Prior Publication Data

US 2008/0032243 A1 Feb. 7, 2008

Related U.S. Application Data

(63) Continuation-in-part of application No. 11/296,826, filed on Dec. 7, 2005, now abandoned.

(30) Foreign Application Priority Data

May 30, 2005 (KR) .................. 10-2005-0045481

(51) Int. Cl.
*C08F 2/46* (2006.01)
(52) U.S. Cl. ............ 427/487; 427/581; 427/582; 430/2; 430/80
(58) Field of Classification Search .................. 427/487, 427/581, 582; 430/2, 80, 109.3
See application file for complete search history.

(56) References Cited

U.S. PATENT DOCUMENTS

| | | | |
|---|---|---|---|
| 4,856,857 A | 8/1989 | Takeuchi et al. | |
| 5,242,780 A | 9/1993 | Lin et al. | |
| 6,492,075 B1* | 12/2002 | Templeton et al. | 430/5 |
| 6,824,951 B2 | 11/2004 | Lee et al. | |
| 7,064,846 B1* | 6/2006 | Amblard et al. | 356/636 |
| 2002/0160297 A1 | 10/2002 | Fedynyshyn et al. | |
| 2003/0099897 A1* | 5/2003 | Fedynyshyn | 430/192 |
| 2004/0096780 A1* | 5/2004 | Nozaki et al. | 430/313 |
| 2005/0250898 A1 | 11/2005 | Maeda et al. | |
| 2005/0277050 A1* | 12/2005 | Yamazaki et al. | 430/124 |
| 2006/0010684 A1* | 1/2006 | Lee et al. | 29/603.15 |
| 2006/0141390 A1* | 6/2006 | Lee et al. | 430/270.1 |
| 2006/0147834 A1* | 7/2006 | Lee et al. | 430/270.1 |

FOREIGN PATENT DOCUMENTS

| KR | 1998-0011721 | 4/1998 |
|---|---|---|
| KR | 2001-006629 | 7/2001 |

OTHER PUBLICATIONS

Wikipedia, The Free Encyclopedia via http://en.wikipedia.org/wiki/Butanol ; 1 page, 2011.*

(Continued)

*Primary Examiner* — Binh X Tran
(74) *Attorney, Agent, or Firm* — Marshall, Gerstein & Borun LLP

(57) ABSTRACT

A coating composition containing a coating base resin and a $C_4$-$C_{10}$ alcohol as a main solvent, and a method for forming a fine contact of a semiconductor device including the steps of preparing the coating composition, forming a photoresist film on a semiconductor substrate having an underlying layer, performing exposure with a contact mask and developing processes to form a photoresist pattern for contact on the photoresist film, and coating the coating composition on the photoresist pattern to form a coating film.

7 Claims, 4 Drawing Sheets

OTHER PUBLICATIONS

Korean Intellectual Property Office Notice of Rejection, for Korean Patent Application No. 10-2005-0045481, dated Nov. 15, 2006.
"Resists Join the Sub-λ Revolution", Laura J. Peters, Semiconductor International, (http://www.semipark...) Sep. 1999, 7 pages.
Safety data for 1-pentanol, http://ptcl.chem.ox.ac.us/MSDS/PE/1-pentanol.html; pp. 1-2; Oct. 1, 2005.
Material Safety data Sheet; Hexyl Alcohol, http://www.jtbaker.com/msds/englishtml/h2607.htm;pp. 1-7; Feb. 12, 2004.

* cited by examiner

PHOTORESIST COATING COMPOSITION AND METHOD FOR FORMING FINE CONTACT OF SEMICONDUCTOR DEVICE

CROSS REFERENCE TO RELATED APPLICATIONS

This is a continuation-in-part of U.S. application Ser. No. 11/296,826 (the disclosure of which is incorporated herein by reference in its entirety), filed Dec. 7, 2005, now abandoned, which claims foreign priority from Korean Application No. KR 2005-0045481, filed May 30, 2005.

BACKGROUND OF THE DISCLOSURE

1. Field of the Disclosure

The disclosure relates to a coating composition and a method for forming a fine contact of a semiconductor device using the same.

2. Description of the Related Technology

In order to overcome the resolution limit of exposures in forming a fine contact of a semiconductor device, a phase shift mask is typically used or a contact is heated at above the glass transition temperature of the photoresist to cause flow (known as a resist flow process, as described in U.S. Pat. No. 6,824,951, the disclosure of which is incorporated herein by reference). Otherwise, a RELACS (Resolution Enhancement Lithography Assisted by Chemical Shrink process, as described in "Resists Join the Sub-λ Revolution", Semiconductor International, 1999. 9, Laura J. Peters ed., the disclosure of which is incorporated herein by reference,) process is performed to reduce the size of the contact, thereby obtaining a fine contact suitable for a high degree of integration of semiconductor devices.

However, when the phase shift mask is used, a side-lobe is generated or the resolution is degraded during the process for forming a pattern.

In the resist flow process, even when the same thermal energy is transmitted to the entire surface of the photoresist at over the glass transition temperature, the flowing amount of the photoresist is larger in the lower portion than in the upper or middle portion so as to cause an over-flow, with the space between the upper portion of the patterns is wider than the space between the lower portion of the patterns.

In the RELACS process, materials are expensive, and water-soluble polymers are not completely removed but remain on the pattern to affect subsequent etching processes. As a result, it is possible to generate defects in manufactured devices, thereby decreasing yield and reliability of devices.

Moreover, when a coating process is performed on the contact, the size of the formed contact can be smaller than the original one of the contact. However, since water is used as a solvent, coating properties may be degraded.

Although an organic solvent can be used to improve the coating properties, the organic solvent dissolves a lower photoresist layer. In order to prevent the lower photoresist layer from being dissolved by the organic solvent, the coating composition should be cross-linked after the contact is formed. For this cross-linking, an additional process such as electronic beam curing, thermal curing, or ultraviolet curing is required.

SUMMARY OF THE DISCLOSURE

A coating composition contains a coating base resin and a $C_4$-$C_{10}$ alcohol as a main solvent, and a method for forming a fine contact sufficient for high integration of a semiconductor device including performing a coating process on a contact using the coating composition.

BRIEF DESCRIPTION OF THE DRAWINGS

For a more complete understanding of the invention, reference should be made to the following detailed description and accompanying drawings wherein.

DETAILED DESCRIPTION OF PREFERRED EMBODIMENTS

The disclosed coating composition contains a coating base resin and $C_4$-$C_{10}$ alcohol as a main solvent.

The $C_4$-$C_{10}$ alcohol is preferably a compound selected from the group consisting of cyclopentanol, cycloheptanol, butanol, pentanol, hexanol, octanol, nonanol, decanol, and mixtures thereof. The alcohol solvent dissolves the lower photoresist layer when the carbon number is less than four, and the volatility of the solvent is so small to be used as a coating solvent when the number of carbon is more than ten.

The coating composition includes a coating base resin, and the coating base resin is preferably, but not necessarily, an acrylic resin. Herein the term "acrylic resin" means the resin produced essentially by polymerization of acrylic acid, methacrylic acid and derivatives thereof. A preferred example of acrylic resin is poly(t-butylacrylate/methacrylic acid/methyl methacrylate).

The disclosure also provides a method for forming a fine contact of a semiconductor device.

The method includes the steps of:

(a) preparing a coating composition according to the disclosure;

(b) forming a photoresist film on a semiconductor substrate having an underlying layer;

(c) performing exposure with a contact mask and a developing process to form a photoresist pattern for contact on the photoresist film; and (d) coating the coating composition on the photoresist pattern to form a coating film.

Preferably, the method further includes the step of performing a resist flow process or the step of performing a RELACS (Resolution Enhancement Lithography Assisted by Chemical Shrink) process onto the photoresist pattern after step (b) and before step (c) in order to form a fine contact having a smaller contact region.

The disclosure will be described in detail with FIGS. 1a and 1b.

Figure 1A:
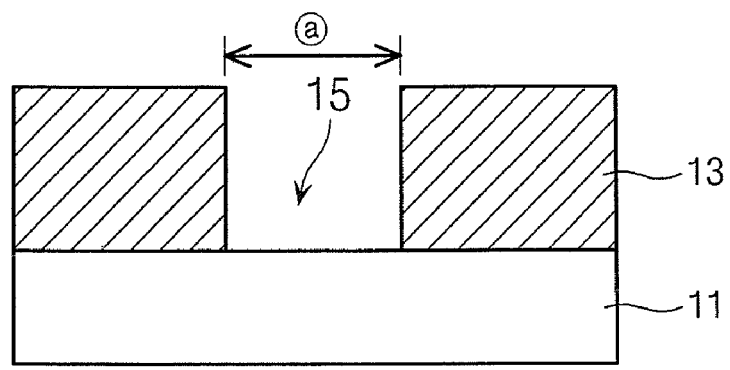
FIGS. 1a and 1b are cross-sectional diagram illustrating a method according to the disclosure for forming a fine contact of a semiconductor device.

Referring to FIG. 1a, a photoresist composition is coated on a semiconductor substrate 11 having an underlying layer to form a photoresist film.

Next, a photoresist film 13 containing a contact region 15 is formed by an exposure and developing process with a contact mask (not shown).

The contact region 15 is formed to have a diameter (a).

Figure 1B:
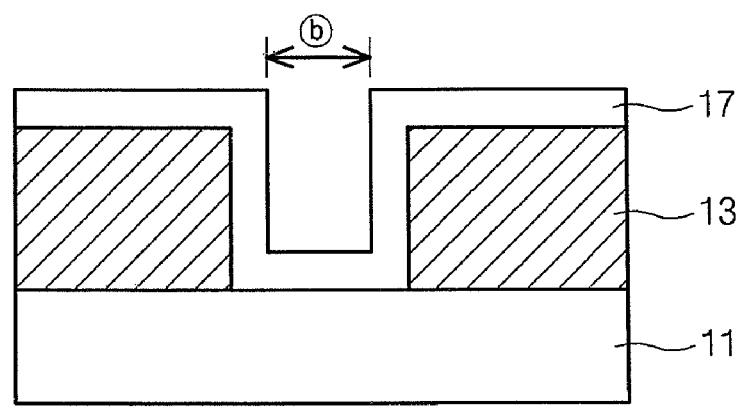

Referring to FIG. 1b, a coating composition is coated on the entire surface including the contact region 15 to form a coating film 17 having a thickness ranging from 20 nm to 100 nm.

The coating composition obtained by dissolving acrylic resin as a base resin in $C_4$-$C_{10}$ alcohol as a main solvent is applied by simple spin-coating to form a coating film 17 by volatilization of the alcohol. The additional process such as the curing process is not required since the $C_4$-$C_{10}$ alcohol does not dissolve the lower photoresist layer.

As a result, the coating film 17 reduces a diameter of the contact region 15 into the size (b).

The diameter of the contact region 15 can be adjusted depending on the thickness of the coating film 17.

As described above, the size of the contact region 15 is changed by regulation of the thickness of the disclosed coating film 17, and the thickness of the coating film 17 can be regulated as intended to improve reproducibility of the process and minimize characteristic change of devices, thereby facilitating high-integration of semiconductor devices.

Before the coating film 17 is formed, the photoresist pattern 13 can be heated at over a glass transition temperature of photoresist to cause flow or a RELACS process can be performed, forming the diameter of the contact region 15 to be smaller than (a) in advance, and then the coating film 17 is formed. As a result, the diameter of the contact region can be regulated to be even smaller.

EXAMPLES

The disclosure will be described in details by referring to examples below, which are given to illustrate not to limit the disclosed coating compounds and method.

Example 1

Preparation of a Coating Base Resin

To acetone (50 g) were dissolved t-butylacrylate (5.0 g), methacrylic acid (2.0 g), methyl methacrylate (3.0 g) and AIBN (2,2'-azobisisobutyronitrile) (0.02 g) as a polymerization initiator, and then the resulting mixture was polymerized at about 67° C. for about 6 hours. After polymerization is completed, the resulting mixture was filtered and vacuum dried to obtain poly(t-butylacrylate/methacrylic acid/methyl methacrylate) (yield: 88%).

Example 2

Preparation of a Coating Composition (1)

The poly(t-butylacrylate/methacrylic acid/methyl methacrylate) (1 g) obtained from Example 1 was dissolved in cycloheptanol (80 g) to obtain a coating composition.

Example 3

Preparation of a Coating Composition (2)

The poly(t-butylacrylate/methacrylic acid/methyl methacrylate) (1 g) obtained from Example 1 was dissolved in cyclopentanol (70 g) to obtain a disclosed coating composition.

Comparative Example

Formation of a Photoresist Pattern for Contact (1)

An ArF photoresist composition 7039R (produced by TOK Co.) was coated on a silicon wafer, and soft-baked at about 120° C. for about 90 seconds. After soft-baking, the photoresist film was exposed to light using an ArF laser Scanner XT: 1400E (ASML Inc.), and post-baked at about 120° C. for about 90 seconds. After post-baking, it was developed in 2.38 wt % tetramethylammonium hydroxide (TMAH) aqueous solution for about 40 seconds, to obtain a 134 nm photoresist pattern for contact (see FIG. 2).

Example 4

Formation of a Photoresist Pattern for Contact (2)

Figure 2:
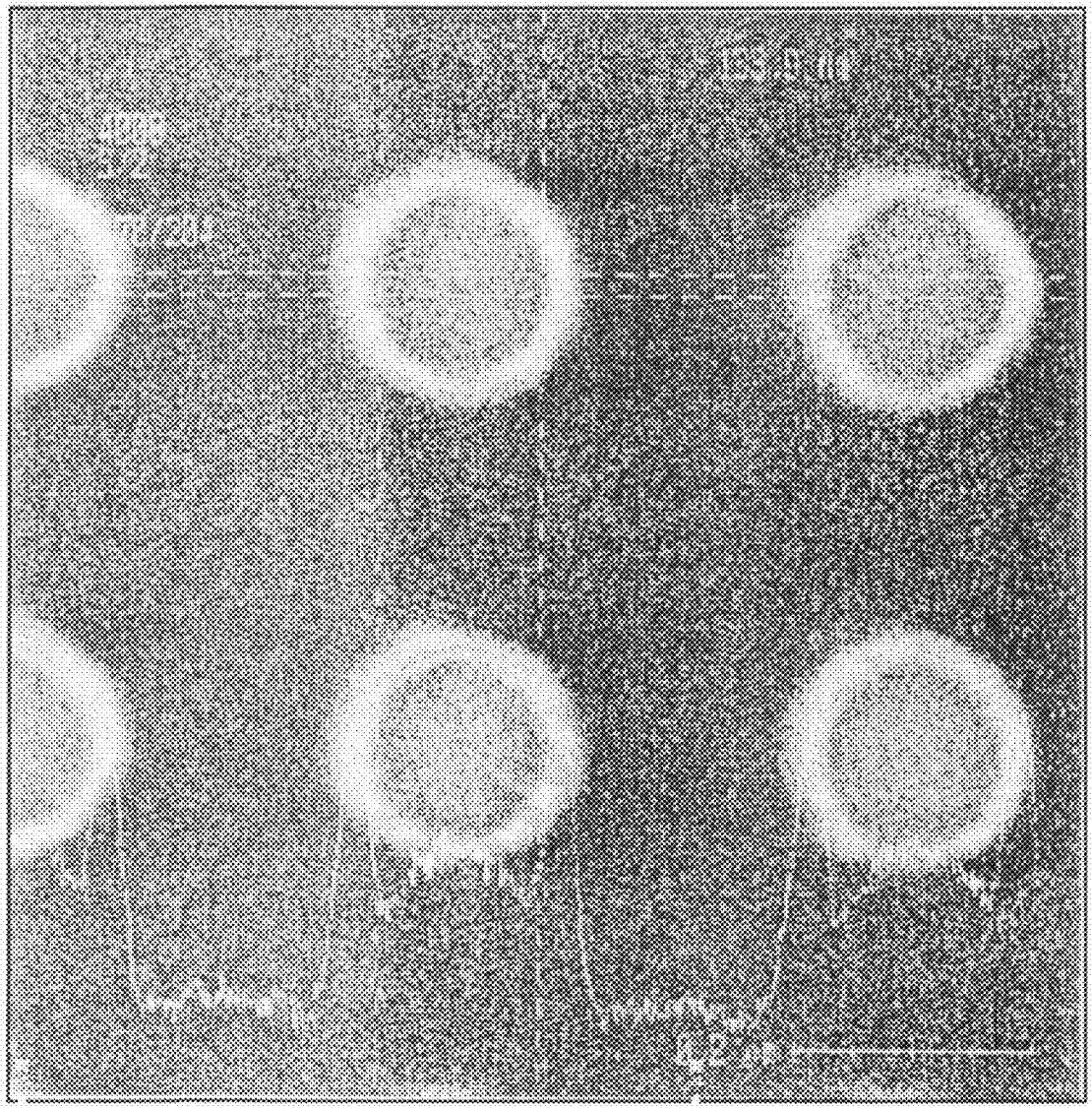
FIG. 2 is a SEM photograph illustrating a photoresist pattern for contact obtained from a Comparative Example.
Figure 3:
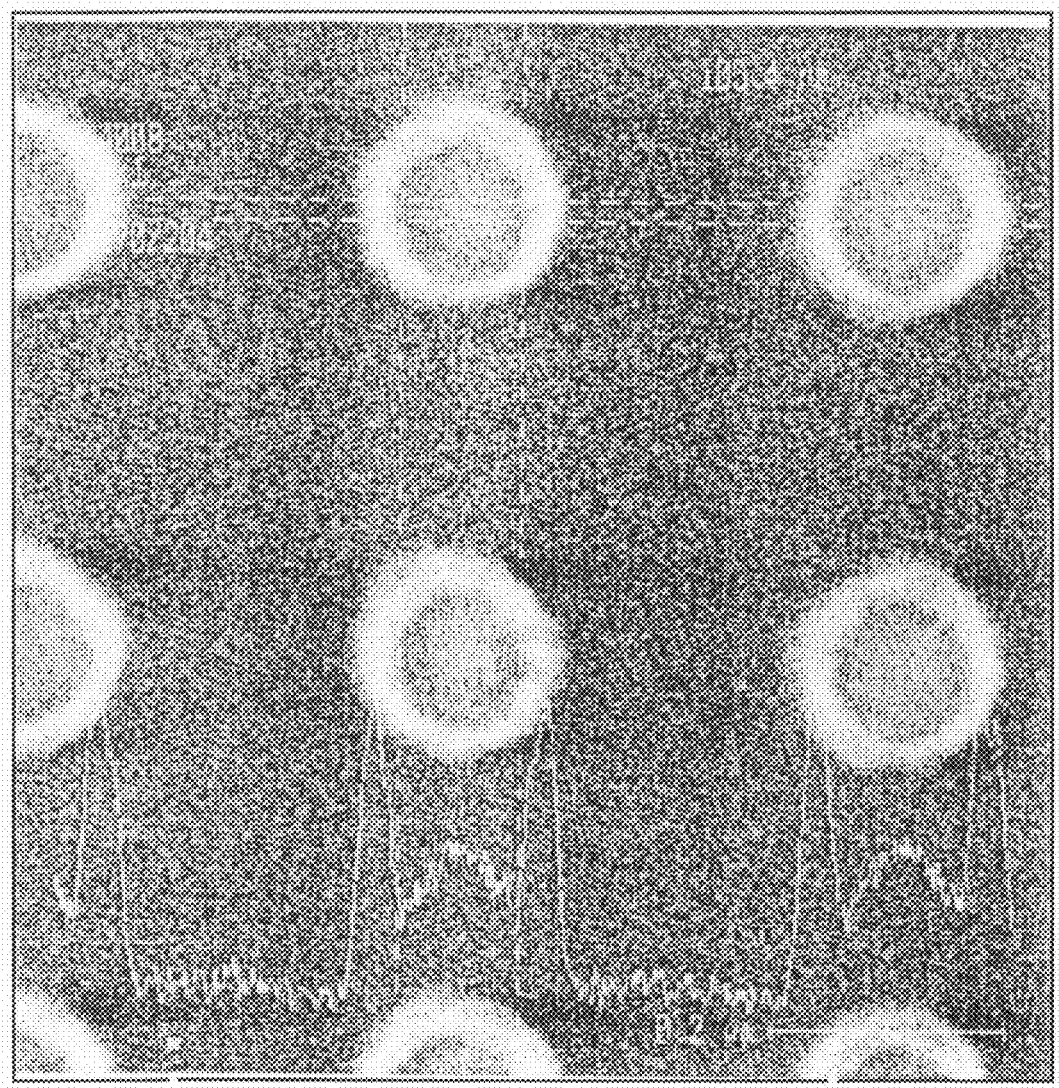
FIG. 3 is a SEM photograph illustrating a photoresist pattern for contact obtained from Example 4.

The coating composition obtained from Example 2 was spin-coated on the 134 nm photoresist pattern for contact shown in FIG. 2 by the same procedure of Comparative Example to obtain a 105 nm photoresist pattern (see FIG. 3).

That is, by forming the coating film with cycloheptanol as the alcohol solvent having the number of carbon of over 4, the obtained photoresist pattern for contact was smaller by 29 nm than the photoresist pattern for contact obtained from Comparative Example where the coating film was not formed.

Example 5

Formation of a Photoresist Pattern for Contact (3)

Figure 4:
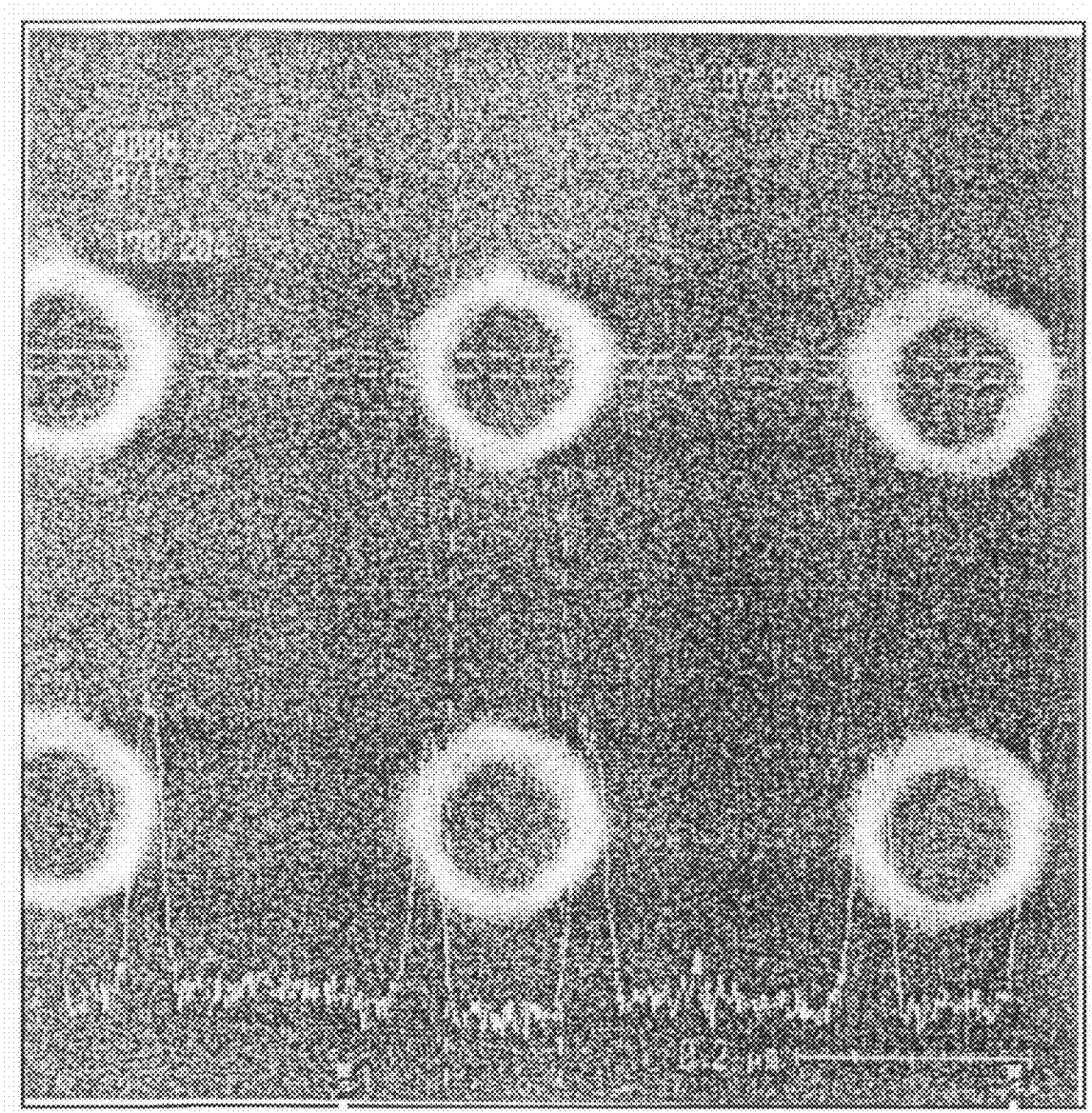
FIG. 4 is a SEM photograph illustrating a photoresist pattern for contact obtained from Example 5.

The coating composition obtained from Example 3 was spin-coated on the 134 nm photoresist pattern for contact shown in FIG. 2 by the same procedure of Comparative Example to obtain a 98 nm photoresist pattern (see FIG. 4).

That is, by forming the coating film with cyclopentanol as the alcohol solvent having the number of carbon of over 4, the obtained photoresist pattern for contact was smaller by 36 nm than the photoresist pattern for contact obtained from Comparative Example where the coating film was not formed.

As described above, in order to obtain a fine contact, a contact is first formed, and a coating composition using a $C_4$-$C_{10}$ alcohol as a main solvent for coating composition is coated thereon to form a coating film. As a result, the photoresist pattern for contact having a smaller contact region can be obtained rather than when the coating film is not formed.

What is claimed is:

1. A method for forming a fine contact of a semiconductor device, comprising the steps of:
   (a) providing a coating composition comprising a coating base resin comprising poly(t-butylacrylate/methacrylic acid/methacrylate) and a $C_4$-$C_{10}$ alcohol as a main solvent;
   (b) forming a photoresist film on a semiconductor substrate having an underlying layer;
   (c) patterning the photoresist film to form a first photoresist pattern; and
   (d) coating the coating composition along a surface of the first photoresist pattern for contact to form a second photoresist pattern for contact, wherein contact regions of the first photoresist pattern and the second photoresist pattern have predetermined diameters, and a contact region of the second photoresist pattern is smaller than a contact region of the first photoresist pattern.

2. The method of claim 1, further comprising the step of performing a resist flow process onto the first photoresist pattern of step (c) before step (d).

3. The method of claim 1, further comprising the step of performing a RELACS (Resolution Enhancement Lithography Assisted by Chemical Shrink) process onto the first photoresist pattern of step (c) before step (d).

4. The method of claim 1, comprising forming the coating film to a thickness in the range of 20 nm to 100 nm.

5. The method of claim 1, wherein the $C_4$-$C_{10}$ alcohol is present in an amount ranging from about 400 g to 4000 g based on 100 g of the coating base resin.

6. The method of claim 1, wherein the $C_4$-$C_{10}$ alcohol is a compound selected from the group consisting of cyclopentanol, cycloheptanol, butanol, pentanol, hexanol, octanol, nonanol, decanol, and mixtures thereof.

7. The method of claim 1, wherein the coating composition consists essentially of the coating base resin and the $C_4$-$C_{10}$ alcohol as a main solvent.

* * * * *